(12) United States Patent
Whang et al.

(10) Patent No.: US 10,181,005 B2
(45) Date of Patent: Jan. 15, 2019

(54) LAYOUT OF PASSENGER ARRANGEMENTS IMPLEMENTATION USING PREVIOUSLY DESIGNED CONFIGURATIONS

(71) Applicant: The Boeing Company, Chicago, IL (US)

(72) Inventors: Chongman Whang, Lynnwood, WA (US); Anthony Earl Anderson, Snohomish, WA (US)

(73) Assignee: The Boeing Company, Chicago, IL (US)

( * ) Notice: Subject to any disclaimer, the term of this patent is extended or adjusted under 35 U.S.C. 154(b) by 523 days.

(21) Appl. No.: 14/879,372

(22) Filed: Oct. 9, 2015

(65) Prior Publication Data

US 2017/0103159 A1    Apr. 13, 2017

(51) Int. Cl.
    *G06F 17/50*    (2006.01)
(52) U.S. Cl.
    CPC ...... *G06F 17/5095* (2013.01); *G06F 17/5004* (2013.01)
(58) Field of Classification Search
    CPC .................. G06F 17/5095; G06F 17/5004
    USPC .............................................. 703/1
    See application file for complete search history.

(56) References Cited

U.S. PATENT DOCUMENTS

| | | |
|---|---|---|
| 7,529,649 B2 | 5/2009 | Lee et al. |
| 8,060,345 B2 | 11/2011 | Lee et al. |
| 8,170,843 B2 | 5/2012 | Lee |
| 9,058,464 B2 | 6/2015 | Song et al. |
| 2005/0209830 A1* | 9/2005 | Lee ............... G06F 17/5095 703/1 |
| 2007/0027856 A1 | 2/2007 | Lee |
| 2010/0145492 A1* | 6/2010 | Russell ............... G06F 17/50 700/103 |
| 2010/0235206 A1 | 9/2010 | Miller et al. |
| 2012/0065944 A1 | 3/2012 | Nielsen et al. |
| 2013/0158955 A1 | 6/2013 | Song et al. |
| 2014/0012545 A1 | 1/2014 | Tsongas et al. |
| 2014/0278270 A1* | 9/2014 | Savian ............... G06F 17/5095 703/1 |

(Continued)

FOREIGN PATENT DOCUMENTS

EP    2790117 A1    10/2014

OTHER PUBLICATIONS

Extended European Search Report, dated Mar. 31, 2017, regarding Application No. EP16179761.8, 10 pages.

(Continued)

*Primary Examiner* — Eunhee Kim
(74) *Attorney, Agent, or Firm* — Yee & Associates, P.C.

(57) ABSTRACT

A system and method for implementing a layout of passenger arrangements using previously designed configurations. A plurality of tools for implementing a layout of passenger arrangements using previously designed configurations is provided. The plurality of tools comprise a previously designed configurations identification and selection tool configured for selecting previously designed configurations to include in the layout of passenger arrangements and a previously designed configuration visualization tool for displaying a degree to which the layout of passenger arrangements comprises previously designed configurations. A tool selection user interface may be provided to receive input from an operator identifying a one of the plurality of tools to run.

20 Claims, 18 Drawing Sheets

(56) References Cited

U.S. PATENT DOCUMENTS

2015/0205910 A1* 7/2015 Lindgren ............ G06F 17/5095
                                                                       703/1

OTHER PUBLICATIONS

Office Action, dated Jul. 20, 2015, regarding U.S. Appl. No. 13/860,846, 23 pages.
Notice of Allowance, dated Feb. 1, 2017, regarding U.S. Appl. No. 13/860,846, 8 pages.
Office Action, dated Mar. 31, 2016, regarding U.S. Appl. No. 13/860,846, 23 pages.
Roland, Romain, et al. "E-commerce and Web 3D for involving the customer in the design process: the case of a gates 3D configurator," Proceedings of the 2012 Virtual Reality International Conference, ACM 2012.
Extended European Search Report, dated Jul. 7, 2014, regarding Application No. EP14158823.6, 6 pages.
Sims, Dave. "New realities in aircraft design and manufacture." Computer Graphics and Applications, IEEE 14.2 (1994): 91.
Final Office Action, dated Oct. 16, 2015, regarding U.S. Appl. No. 13/860,846, 20 pages.

* cited by examiner

FIG. 6

Welcome Doe, John     Home Preferences Help Logout

| Airplane Program | ▼ |
|---|---|
| Minor Model | ▼ |
| Customer Name | ▼ |
| Effectivity | |

[Load CAD Block]

☐ Commodities

| Installation(EA) Tracking Sys | LOPA Visualization | Smart LOPA | CID Decoder |
|---|---|---|---|

Upload CID Data

[Browse...] No file selected.    [Upload]

| Airplane Program * | 787 ▼ | Customer Name * | BEJ |
|---|---|---|---|
| Minor Model * | 9 ▼ | Customer Eff No * | ZB047-ZB ▼ |
| LOPA ID Number * | 879-02 ▼ | | |

View CID Data

[View]     [Print]     [Export]

| CommodityCode | | Side | Designator | Action |
|---|---|---|---|---|
| BC-CTR_FURNITURE | | Center | | |
| BC_RH_FUNITURE | | Right | | |
| CALPODL-BC-LAST | | Left | | |
| CALPODR-BC-LAST | | Right | | |
| CALPODC_BC-LAST | | Center | | |
| CALPODR-BC_FRT | | Right | | |
| CALPODL-BC_FRT | 120.00 | Left | | |
| CALPODC-BC-CTR | 120.00 | Center | | |
| CALPODR-BC-FRT | 120.00 | Right | PASSENGER SEAT | |
| CALPODL-BC_FRT | 120.00 | Left | PASSENGER SEAT | |
| CALPODC-BC_CTR | 120.00 | Center | PASSENGER SEAT | |
| CALPODR-BC_FRT | 180.00 | Right | PASSENGER SEAT | |

Edit

| CommodityCode | x |
|---|---|
| STA | 234.00 |
| ButtLine | -35.00 |
| Commodity Type | Gl ▼ |
| | Ceiling |
| | FH Stowage |
| | Galley |
| Designator | Galley Bar Unit |

[save]

LAYOUT OF PASSENGER ARRANGEMENTS IMPLEMENTATION USING PREVIOUSLY DESIGNED CONFIGURATIONS

BACKGROUND INFORMATION

1. Field

The present disclosure relates generally to designing and manufacturing aircraft. More particularly, the present disclosure relates to a system and method of implementing a layout of passenger arrangements for an interior of an aircraft using previously designed configurations.

2. Background

Designing an aircraft or other platform may include placing various structures in a design for the aircraft or other platform. For example, designing a commercial passenger aircraft or other aircraft may include placing various structures in a design for a passenger cabin or other area on the interior of the aircraft. The various structures that may be placed at various locations in the design for the interior of the aircraft may be referred to as monuments or commodities. For example, without limitation, such structures may include lavatories, galleys, closets, bar units, seats, walls, dividers, partitions, and other structures or combinations of structures. The design for the placement of commodities in a passenger cabin or other area on the interior of an aircraft may be referred to as a layout of passenger arrangements.

A designer may use a computer-implemented design tool to indicate the desired placement for various structures in a design for the interior of an aircraft or other platform. In order for an aircraft or other platform having such a design to be manufactured, the placement of each structure in the design for the interior of the aircraft or other platform is converted into a detailed engineering design. For example, such an engineering design may specify structural, mechanical, electrical, heating, air circulation, water supply, waste water drainage, or various other components, connections, or combinations of components and connections for implementing the desired placement of the structure in the design for the interior of the aircraft or other platform. The creation of such an engineering design may be relatively time-consuming. For example, each particular configuration of a galley in the design for the interior of an aircraft may require up to 1,000 hours or more of engineering time to design the flooring structure to support the galley and the electrical wiring, plumbing, and other components and connections for implementing the galley at the placement specified in the design.

Therefore, the design of a layout of passenger arrangements for the interior of an aircraft or other platform may present a number of technical problems that may require many hours of engineering time to solve. A detailed engineering design for each configuration of a commodity in the layout of passenger arrangements may need to be created. This detailed engineering design then may be used to implement the layout of passenger arrangements for the interior of the aircraft or other platform during manufacturing of the aircraft or other platform.

The time and cost of implementing a layout of passenger arrangements may be reduced by using previously designed configurations of commodities in layouts of passenger arrangements for aircraft that have already been manufactured. However, current systems and methods for designing aircraft and other platforms do not provide for effectively identify such previously designed configurations and incorporating such previously designed configurations into a layout of passenger arrangements for an aircraft.

Accordingly, it would be beneficial to have a method and apparatus that take into account one or more of the issues discussed above, as well as other possible issues.

SUMMARY

An illustrative embodiment of the disclosure provides a method of implementing a layout of passenger arrangements. A graphical representation of the layout of passenger arrangements is displayed. An indicator is displayed on the representation of the layout of passenger arrangements indicating a location of a commodity in the layout of passenger arrangements for which there are previously designed configurations that may be used. A list of the previously designed configurations that may be used is displayed in response to an operator selecting the location of the commodity in the layout of passenger arrangements. An input by an operator selecting a selected previously designed configuration from the list of previously designed configurations is received. The layout of passenger arrangements is changed to include the selected previously designed configuration.

An illustrative embodiment of the present disclosure also provides a method of implementing a layout of passenger arrangements for an aircraft. A graphical representation of the layout of passenger arrangements is displayed. A level of use of previously designed configurations in the layout of passenger arrangements is determined. A visualization indication is displayed on the representation of the layout of passenger arrangements indicating the level of use of previously defined configurations in the layout of passenger arrangements.

Illustrative embodiments also provide an apparatus comprising a plurality of tools for implementing a layout of passenger arrangements using previously designed configurations and a tool selection user interface configured to receive input from an operator identifying a one of the plurality of tools to run. The plurality of tools comprise a previously designed configurations identification and selection tool configured for selecting previously designed configurations to include in the layout of passenger arrangements and a previously designed configuration visualization tool for displaying a degree to which the layout of passenger arrangements comprises previously designed configurations.

The features, functions, and benefits can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives, and benefits thereof, will best be understood by reference to the following detailed description of illustrative embodiments of the present disclosure when read in conjunction with the accompanying drawings, wherein:

FIG. 6 is an illustration of an installation management and tracking tool user interface in accordance with an illustrative embodiment;

FIG. 7 is an illustration of a coding tool user interface in accordance with an illustrative embodiment;

FIGS. 8 and 9 are illustrations of parts used on tool user interfaces in accordance with an illustrative embodiment;

DETAILED DESCRIPTION

The different illustrative embodiments recognize and take into account a number of different considerations. "A number," as used herein with reference to items, means one or more items. For example, "a number of different considerations" means one or more different considerations.

The different illustrative embodiments recognize and take into account that different purchasers or users of aircraft may have different requirements for the layout of passenger arrangements of an aircraft. The different illustrative embodiments also recognize and take into account, however, that a detailed engineering design may need to be created for each configuration of a commodity in a layout of passenger arrangements for the interior of an aircraft in order for the layout of passenger arrangements to be implemented. The creation of such engineering designs presents a technical problem that may take considerable time and may add to the cost of the aircraft.

The different illustrative embodiments also recognize and take into account that engineering designs for configurations of commodities in layouts of passenger arrangements for the interior of an aircraft may be saved. Engineering design time and costs may be reduced if such previously designed configurations are used to implement a new layout of passenger arrangements for the interior of an aircraft.

The illustrative embodiments provide a technical solution to the problem of implementing a layout of passenger arrangements for the interior of an aircraft or other platform. The illustrative embodiments provide a number of tools for using previously designed configurations of commodities in previously designed layouts of passenger arrangements to implement a new layout of passenger arrangements for the interior of an aircraft. For example, illustrative embodiments may reduce the amount of time and cost needed to generate engineering designs for configurations of commodities in a layout of passenger arrangements for the interior of an aircraft.

Figure 1:
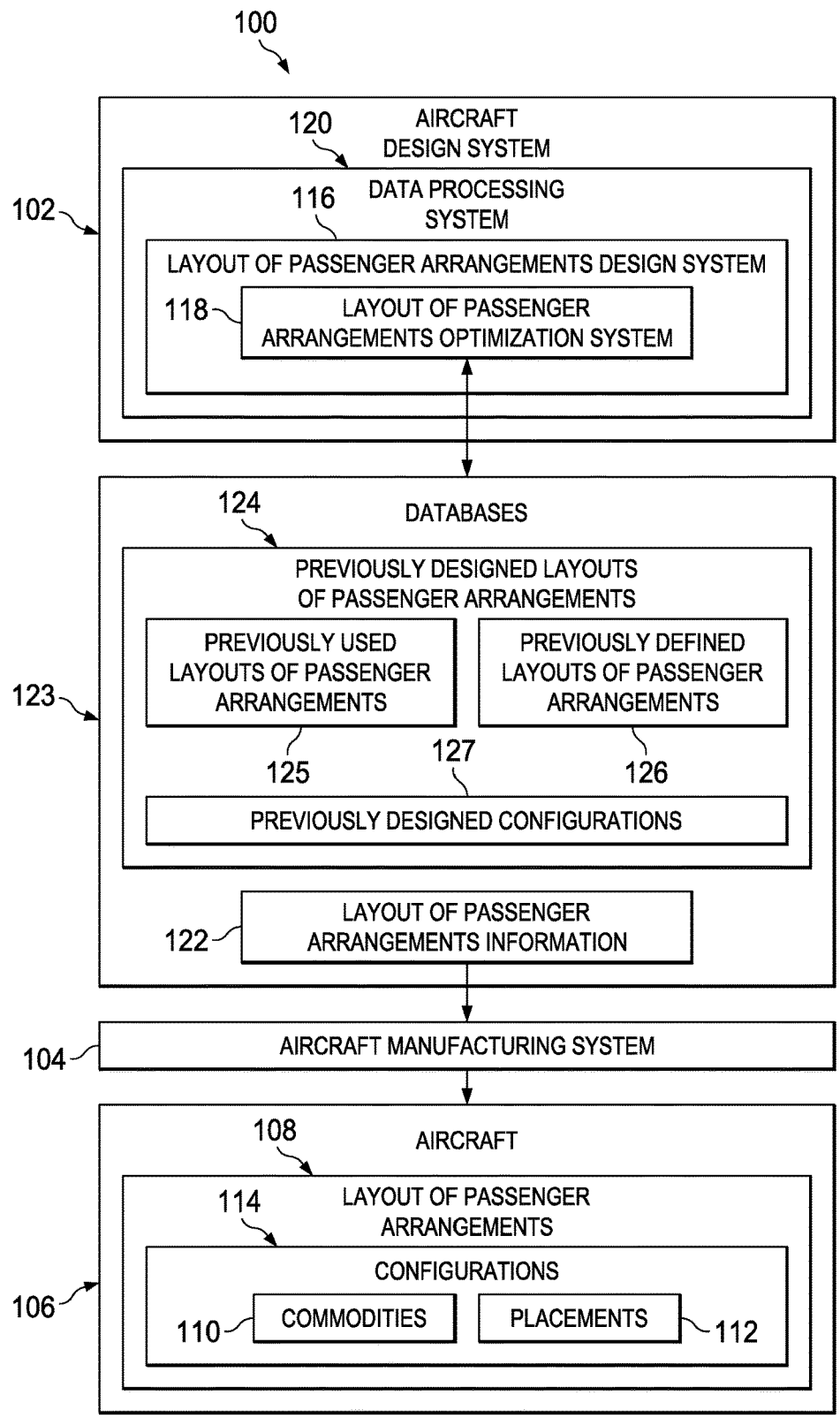
FIG. 1 is an illustration of a block diagram of an aircraft design and manufacturing environment in accordance with an illustrative embodiment.

Turning to FIG. 1, an illustration of a block diagram of an aircraft design and manufacturing environment is depicted in accordance with an illustrative embodiment. Aircraft design and manufacturing environment 100 comprises aircraft design system 102 and aircraft manufacturing system 104 for producing aircraft 106.

Aircraft 106 may be a commercial passenger aircraft or other appropriate aircraft. A portion of the interior of aircraft 106 is defined by layout of passenger arrangements 108. In the present application, including in the claims, the term "layout of passenger arrangements" refers to a design for the placement of commodities in a passenger cabin or other area on the interior of an aircraft. Such commodities may include any appropriate structures in a passenger cabin or other area on an interior of an aircraft, including, without limitation, any structures used by passengers on the aircraft, for providing any appropriate service to passengers on the aircraft, or for any other appropriate purpose or combination of purposes. For example, without limitation, such commodities may include lavatories, galleys, closets, bar units, seats, walls, dividers, partitions, and other structures or combinations of structures.

Layout of passenger arrangements 108 may include a number of commodities 110 at a corresponding number of placements 112 in the interior of aircraft 106. Each placement of a commodity in layout of passenger arrangements 108 may be referred to as a configuration of the commodity in the layout of passenger arrangements 108. Layout of passenger arrangements 108 for aircraft 106 thus may comprise a plurality of configurations 114.

Aircraft design system 102 may include layout of passenger arrangements design system 116 for designing layout of passenger arrangements 108 for aircraft 106. The design for layout of passenger arrangements 108 for aircraft 106 that is created using layout of passenger arrangements design system 116 may be stored as layout of passenger arrangements information 122 in databases 123. Layout of passenger arrangements information 122 may include appropriate information for use by aircraft manufacturing system 104 to implement layout of passenger arrangements 108 in aircraft 106.

Databases 123 may include information defining previously designed layouts of passenger arrangements 124. Previously designed layouts of passenger arrangements 124 may include previously used layouts of passenger arrangements 125 which have been implemented in previously manufactured aircraft. Alternatively, or in addition, previously designed layouts of passenger arrangements 124 may include previously defined layouts of passenger arrangements 126 which have not been implemented in manufactured aircraft.

For example, without limitation, information for previously designed layouts of passenger arrangements 124 may include detailed design information for previously designed configurations 127 of various commodities. In accordance with an illustrative embodiment, the design of layout of passenger arrangements 108 for aircraft 106 may be optimized by using previously designed layouts of passenger arrangements 124, previously designed configurations 127, or both, to the greatest extent possible to design layout of passenger arrangements 108.

In accordance with an illustrative embodiment, layout of passenger arrangements design system 116 may include layout of passenger arrangements optimization system 118. Layout of passenger arrangements optimization system 118 may include a number of tools for using previously designed configurations 127 to implement layout of passenger arrangements 108 for aircraft 106.

Layout of passenger arrangements design system 116 and layout of passenger arrangements optimization system 118 may be implemented in data processing system 120. For example, without limitation, layout of passenger arrangements optimization system 118 may be implemented in hardware or in software running on hardware in data processing system 120.

Figure 2:
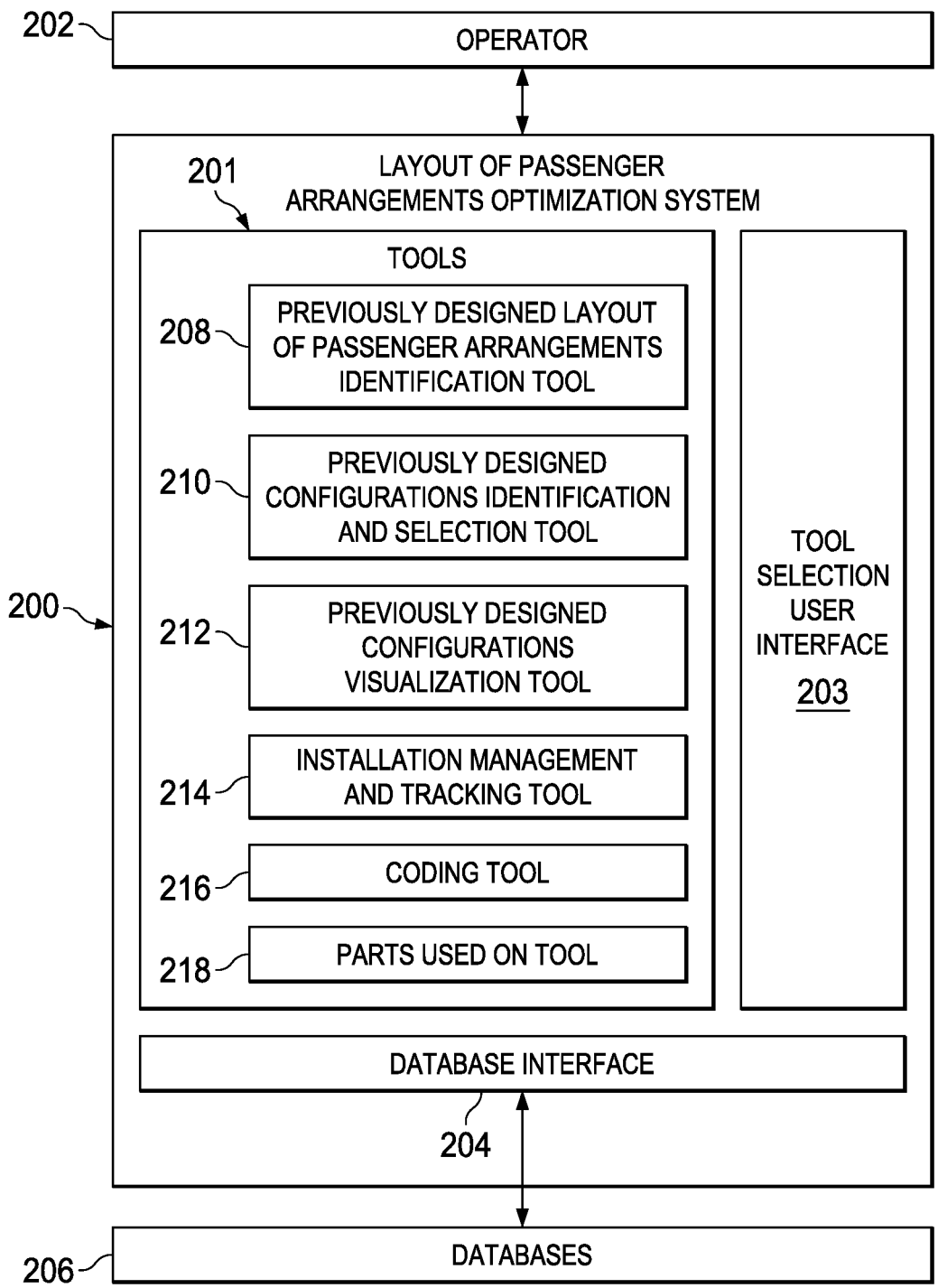
FIG. 2 is an illustration of a block diagram of a layout of passenger arrangements optimization system in accordance with an illustrative embodiment.

Turning to FIG. 2, an illustration of a block diagram of a layout of passenger arrangements optimization system is depicted in accordance with an illustrative embodiment. Layout of passenger arrangements optimization system 200 may be an example of one implementation of layout of passenger arrangements optimization system 118 in FIG. 1.

Layout of passenger arrangements optimization system 200 provides a plurality of tools 201 for use by operator 202 to implement a layout of passenger arrangements for an aircraft using previously designed configurations of commodities. Layout of passenger arrangements optimization system 200 may include tool selection user interface 203 configured to allow operator 202 to select a tool from a plurality of tools 201 to be run. Layout of passenger arrangements optimization system 200 also may include database interface 204 for accessing information in databases 206 that is used by plurality of tools 201. For example, without limitation, databases 206 may be an example of one implementation of databases 123 in FIG. 1. An example process 1000 for using plurality of tools 201 in layout of passenger arrangements optimization system 200 to implement a layout of passenger arrangements using previously designed configurations is described below with reference to FIG. 10.

Plurality of tools 201 provided by layout of passenger arrangements optimization system 200 may include one or more of previously designed layout of passenger arrangements identification tool 208, previously designed configurations identification and selection tool 210, previously designed configurations visualization tool 212, installation management and tracking tool 214, coding tool 216, and parts used on tool 218.

Previously designed layout of passenger arrangements identification tool 208 may be configured for identifying and selecting a previously designed layout of passenger arrangements for an aircraft. An example of a previously designed layout of passenger arrangements identification tool user interface 300 for previously designed layout of passenger arrangements identification tool 208 is described below with reference to FIG. 3. An example process 1100 for using previously designed layout of passenger arrangements identification tool 208 to identify and display a previously designed layout of passenger arrangements is described below with reference to FIG. 11.

Previously designed configurations identification and selection tool 210 may be configured for designing a layout of passenger arrangements for an aircraft using previously designed configurations. An example of a previously designed configurations identification and selection tool user interface 400 for previously designed configurations identification and selection tool 210 is described below with reference to FIG. 4. An example process 1200 for using previously designed configurations identification and selection tool 210 to identify and select a previously designed configuration for a layout of passenger arrangements is described below with reference to FIG. 12.

Previously designed configurations visualization tool 212 may be configured for indicating relative levels of use of previously designed configurations in a layout of passenger arrangements for an aircraft. Installation management and tracking tool 214 may be configured for managing and tracking configurations for commodities in a layout of passenger arrangements for an aircraft. Coding tool 216 may be configured for viewing and changing code information for configurations of commodities. Parts used on tool 218 may be configured for displaying part information for parts used to implement commodities.

Figure 3:
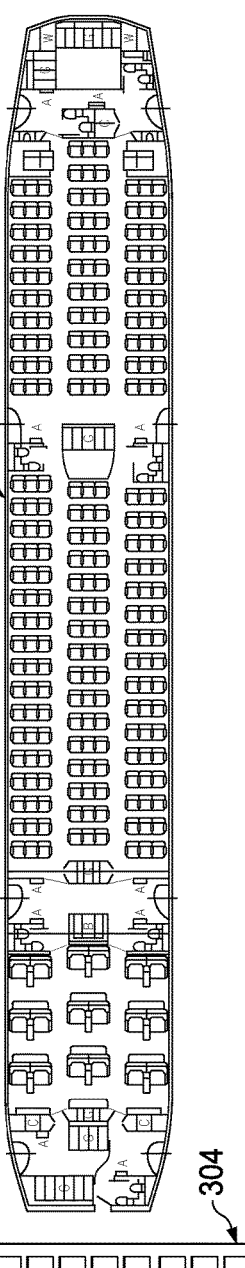
FIG. 3 is an illustration of a user interface for a tool for identification of a previously designed layout of passenger arrangements in accordance with an illustrative embodiment.

Turning to FIG. 3, an illustration of user interface for a tool for identification of a previously designed layout of passenger arrangements is depicted in accordance with an illustrative embodiment. User interface 300 may be an example of a user interface for previously designed layout of passenger arrangements identification tool 208 in layout of passenger arrangements optimization system 200 in FIG. 2. User interface 300 may be referred to as a previously designed layout of passenger arrangements identification tool user interface.

User interface 300 may prompt an operator to identify model 302 of an aircraft and to define a plurality of characteristics 304 of the aircraft. For example, without limitation, plurality of characteristics 304 of the aircraft to be defined may be selected from number of seats, type of seats, seat supplier, ratio of lavatories to seats, ratio of galleys to seats, and ratio of closets to seats.

The information provided via interface 300 may be used to search databases for previously designed layouts of passenger arrangements that satisfy plurality of characteristics 304. Graphical representation 306 of each previously designed layout of passenger arrangements satisfying plurality of characteristics 304 may be displayed on user interface 300. One of such previously designed layouts of passenger arrangements may be selected by the operator and may be used as a starting point for a new layout of passenger arrangements for an aircraft.

Figure 4:
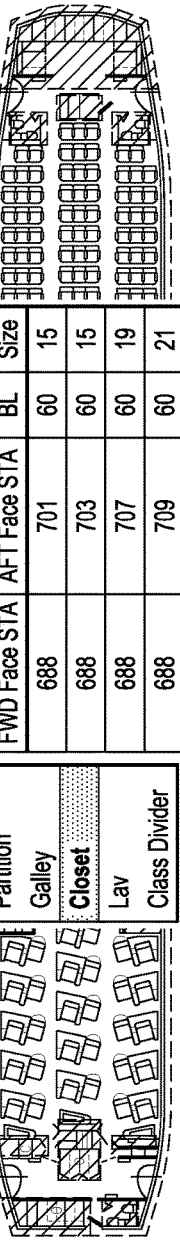
FIG. 4 is an illustration of a user interface for a tool for identification and selection of previously designed configurations in accordance with an illustrative embodiment.

Turning to FIG. 4, an illustration of a user interface for a tool for identification and selection of previously designed configurations is depicted in accordance with an illustrative embodiment. User interface 400 may be an example of one implementation of a user interface for previously designed configuration identification and selection tool 210 in layout of passenger arrangements optimization system 200 in FIG. 2. User interface 400 may be referred to as a previously designed configurations identification and selection tool user interface.

Figure 5:
FIG. 5 is an illustration of a user interface for a tool for visualization of previously designed configurations in accordance with an illustrative embodiment.

Turning to FIG. 5, an illustration of a user interface for a tool for visualization of previously designed configurations is depicted in accordance with an illustrative embodiment. User interface 500 may be an example of one implementation of a user interface for previously designed configurations visualization tool 212 in layout of passenger arrangements optimization system 200 in FIG. 2. User interface 500 may be referred to as a previously designed configuration visualization tool user interface.

Figure 6:
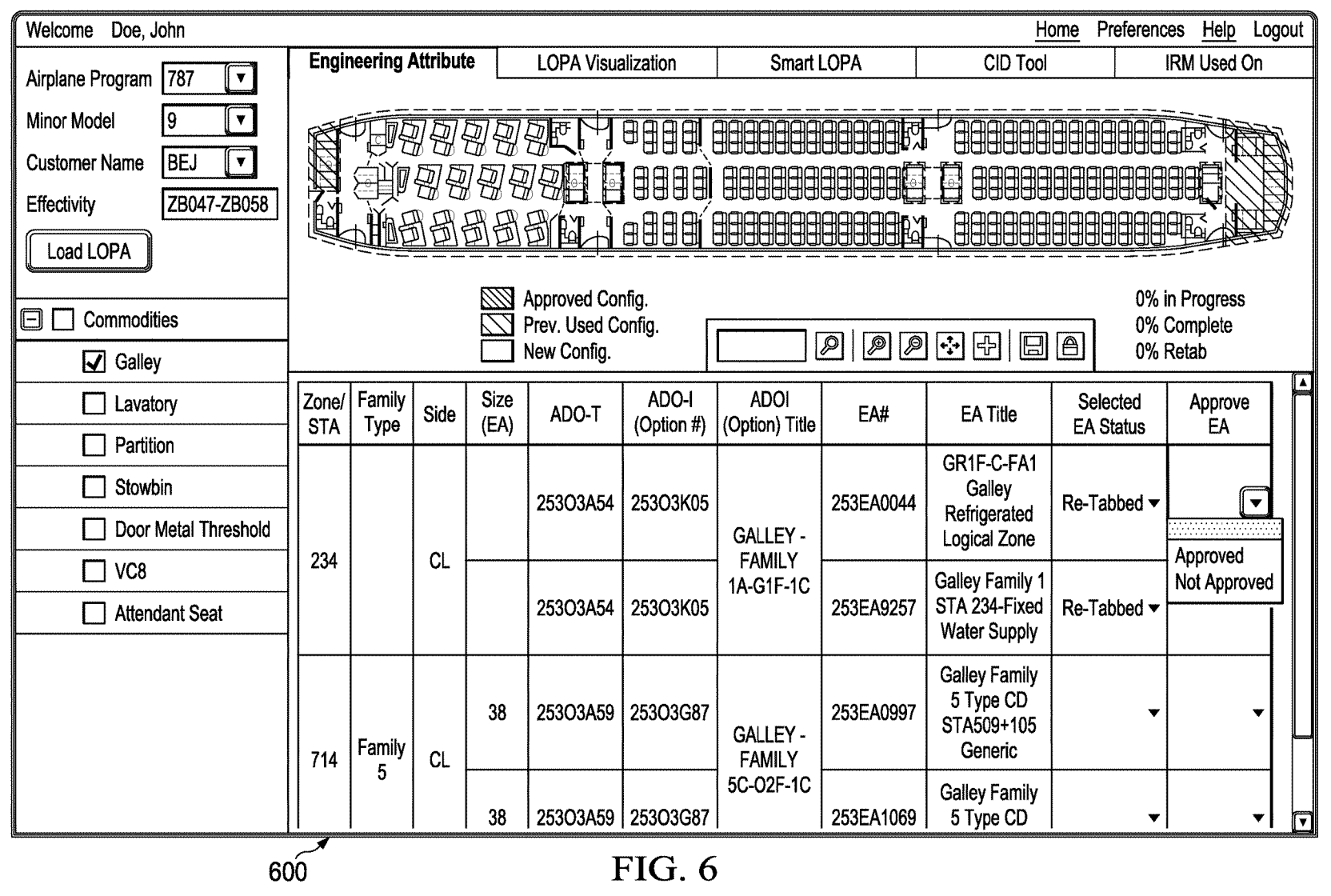

Turning to FIG. 6, an illustration of an installation management and tracking tool user interface is depicted in accordance with an illustrative embodiment. User interface 600 may be an example of one implementation of a user interface for installation management and tracking tool 214 in layout of passenger arrangements optimization system 200 in FIG. 2.

Turning to FIG. 7, an illustration of a coding tool user interface is depicted in accordance with an illustrative embodiment. User interface 700 may be an example of one implementation of a user interface for coding tool 216 in layout of passenger arrangements optimization system 200 in FIG. 2.

Figure 8:
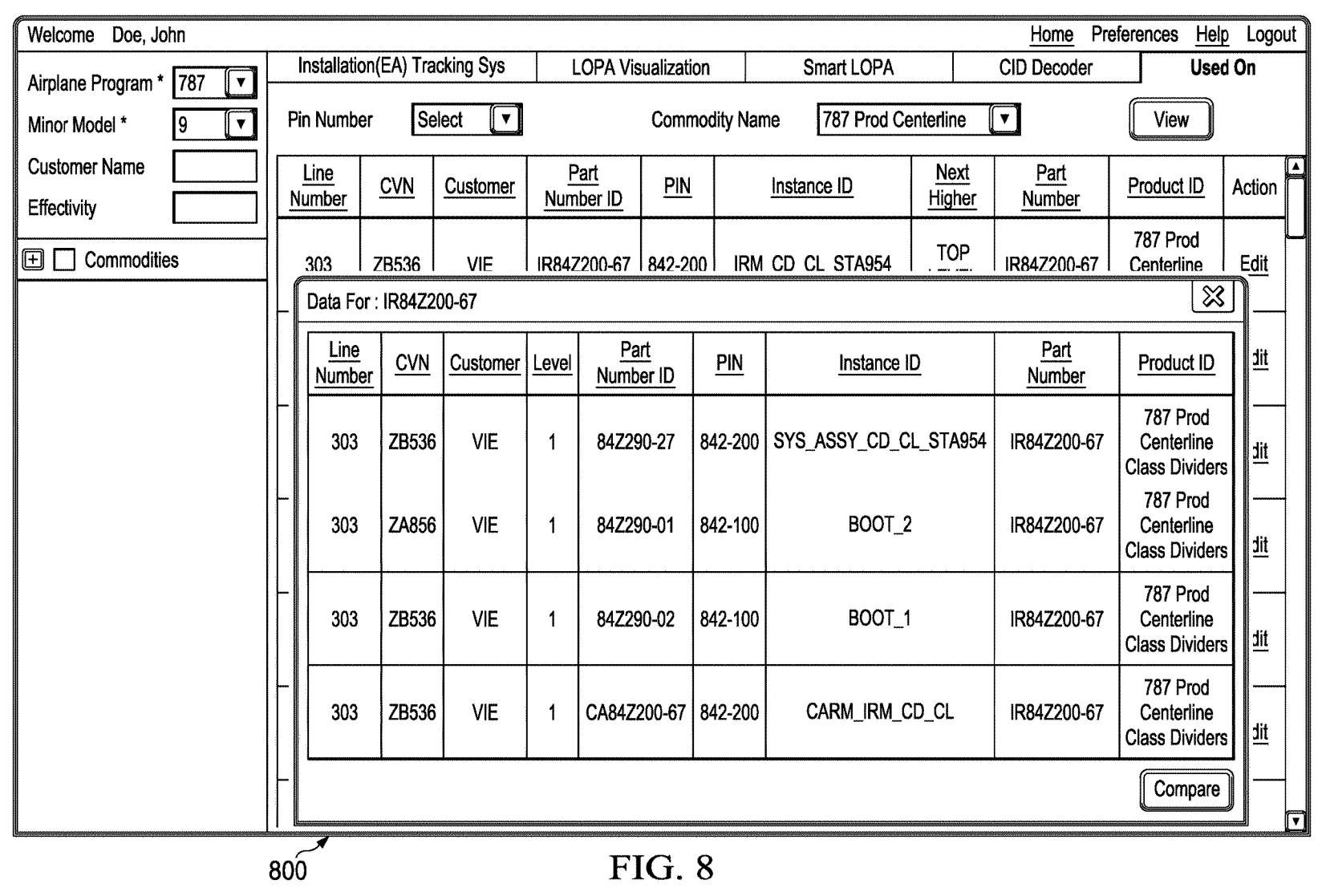
Figure 9:
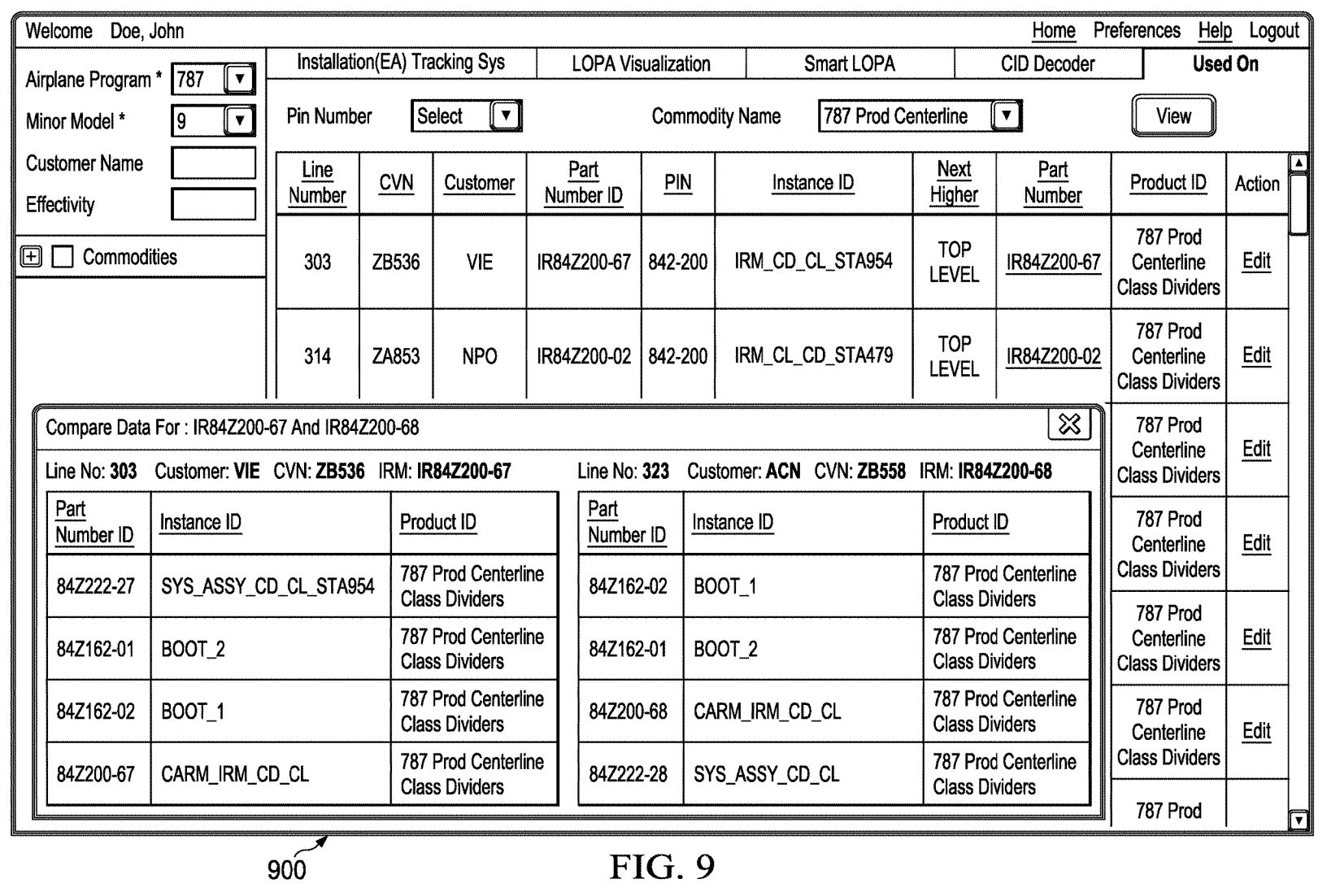

Turning to FIGS. 8 and 9, illustrations of parts used on tool user interfaces are depicted in accordance with an illustrative embodiment. User interface 800 may be an example of one implementation of a user interface for parts used on tool 218 in layout of passenger arrangements optimization system 200 in FIG. 2.

Figure 10:
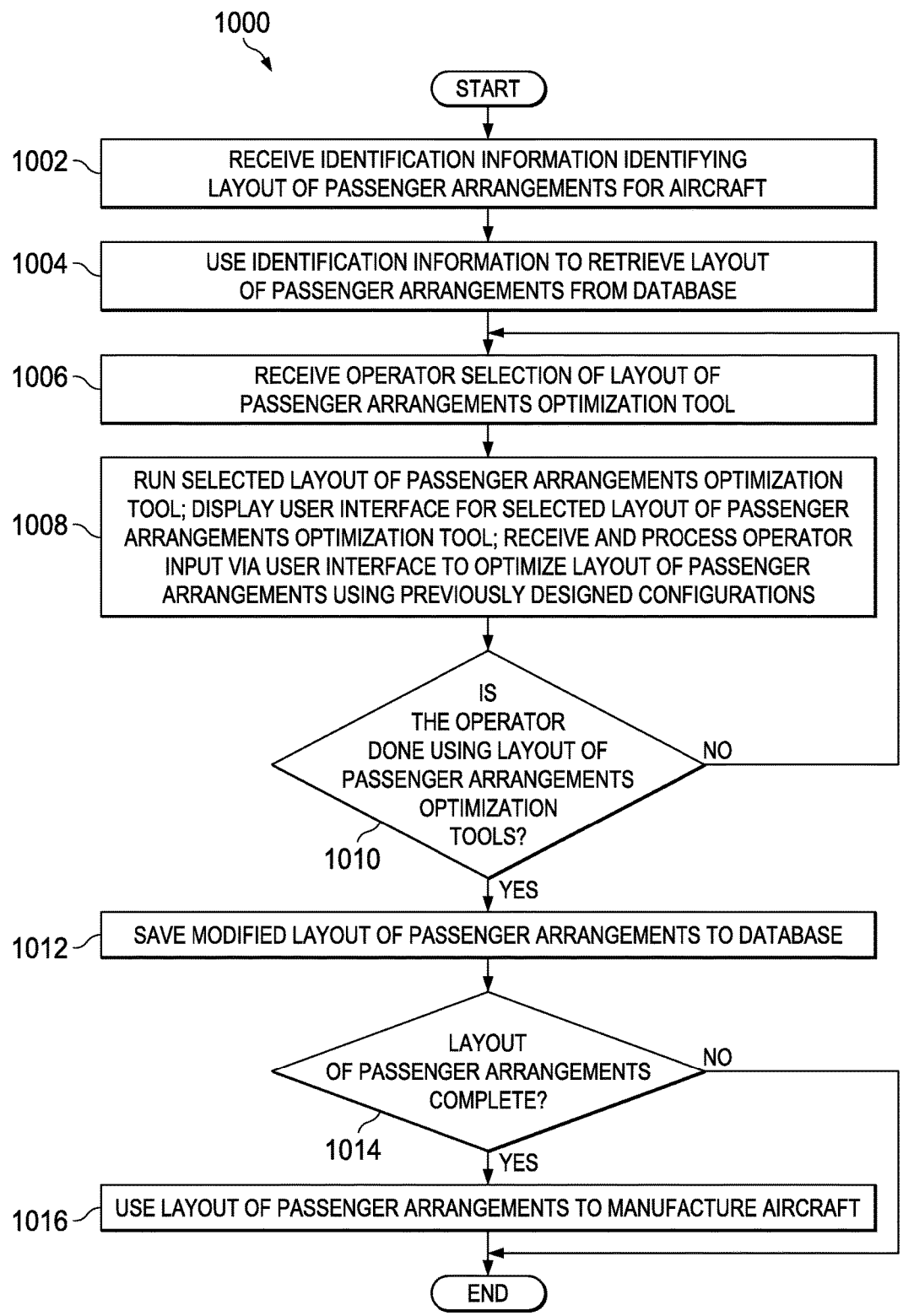
FIG. 10 is an illustration of a flowchart of a process for implementing a layout of passenger arrangements using previously designed configurations of commodities in accordance with an illustrative embodiment.

Turning to FIG. 10, an illustration of a flowchart of a process for implementing a layout of passenger arrangements using previously designed configurations of commodities is depicted in accordance with an illustrative embodiment. Process 1000 may be performed, for example, using layout of passenger arrangements optimization system 200 in FIG. 2.

Process 1000 may begin with receiving identification information identifying a layout of passenger arrangements for an aircraft (operation 1002). The identification information may be used to retrieve a layout of passenger arrangements from a database (operation 1004).

An operator selection of a layout of passenger arrangements optimization tool may be received (operation 1006). The selected layout of passenger arrangements optimization tool may be run, a user interface for the selected layout of passenger arrangements optimization tool may be displayed, and operator input via the user interface may be received and processed to optimize the layout of passenger arrangements using previously designed configurations (operation 1008).

It then may be determined whether the operator is done with using the layout of passenger arrangements optimization tools (operation 1010). Process 1000 may return to operation 1006 in response to a determination that the operator is not done. Otherwise, the modified layout of passenger arrangements optimization tools may be saved to the database (operation 1012).

It then may be determined whether the layout of passenger arrangements is complete (operation 1014). Process 1000 may terminate in response to a determination that the layout of passenger arrangements is complete. Otherwise, the layout of passenger arrangements may be used to manufacture an aircraft, with the process terminating thereafter.

Figure 11:
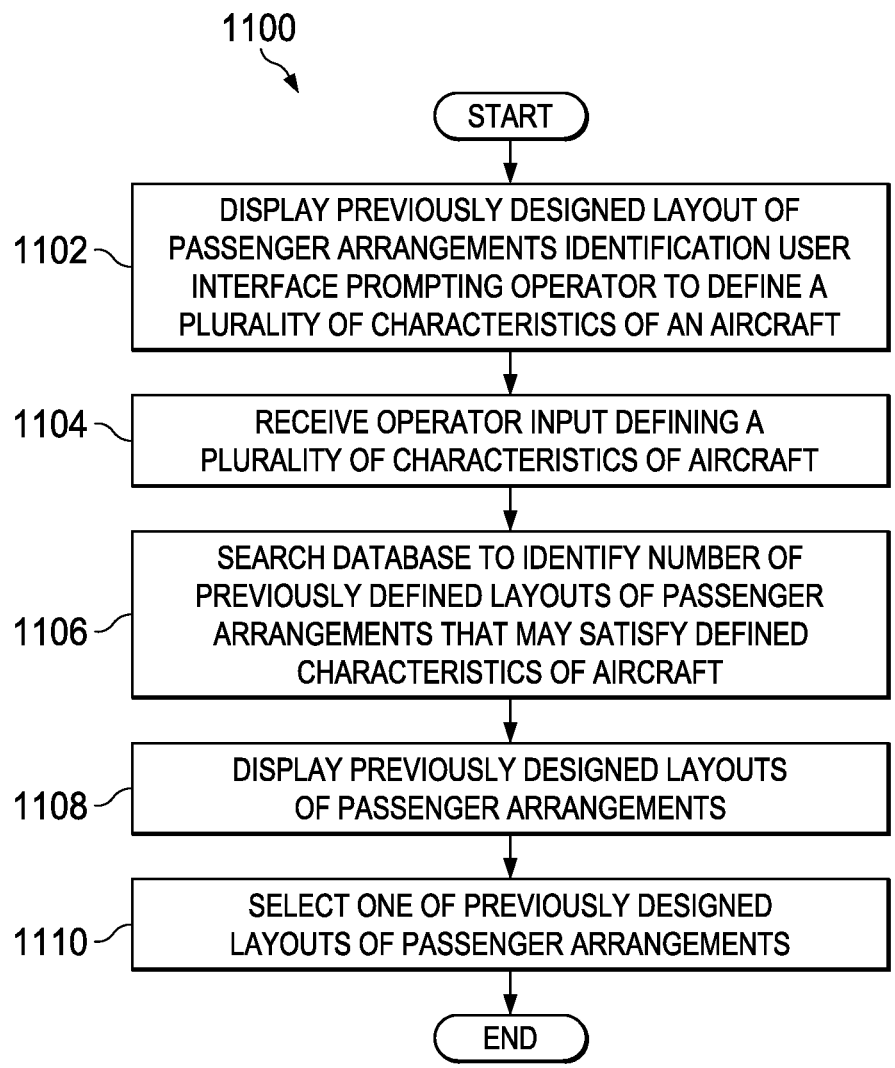
FIG. 11 is an illustration of a flowchart of a process for selecting a previously designed layout of passenger arrangements for an aircraft in accordance with an illustrative embodiment.

Turning to FIG. 11, an illustration of a flowchart of a process for selecting a previously designed layout of passenger arrangements for an aircraft is depicted in accordance with an illustrative embodiment. Process 1100 may be performed, for example, using previously designed layout of passenger arrangements identification tool 208 in layout of passenger arrangements optimization system 200 in FIG. 2.

Process 1100 may begin with displaying a previously designed layout of passenger arrangements identification user interface prompting an operator to define a plurality of characteristics of an aircraft (operation 1102). Operator input defining the plurality of characteristics of the aircraft then may be received (operation 1104). A database then may be searched to identify a number of previously defined layouts of passenger arrangements that may satisfy the defined characteristics of the aircraft (operation 1106). The previously designed layouts of passenger arrangements then may be displayed (operation 1108). One of the number of previously designed layouts then may be selected (operation 1110), with the process terminating thereafter.

Figure 12:
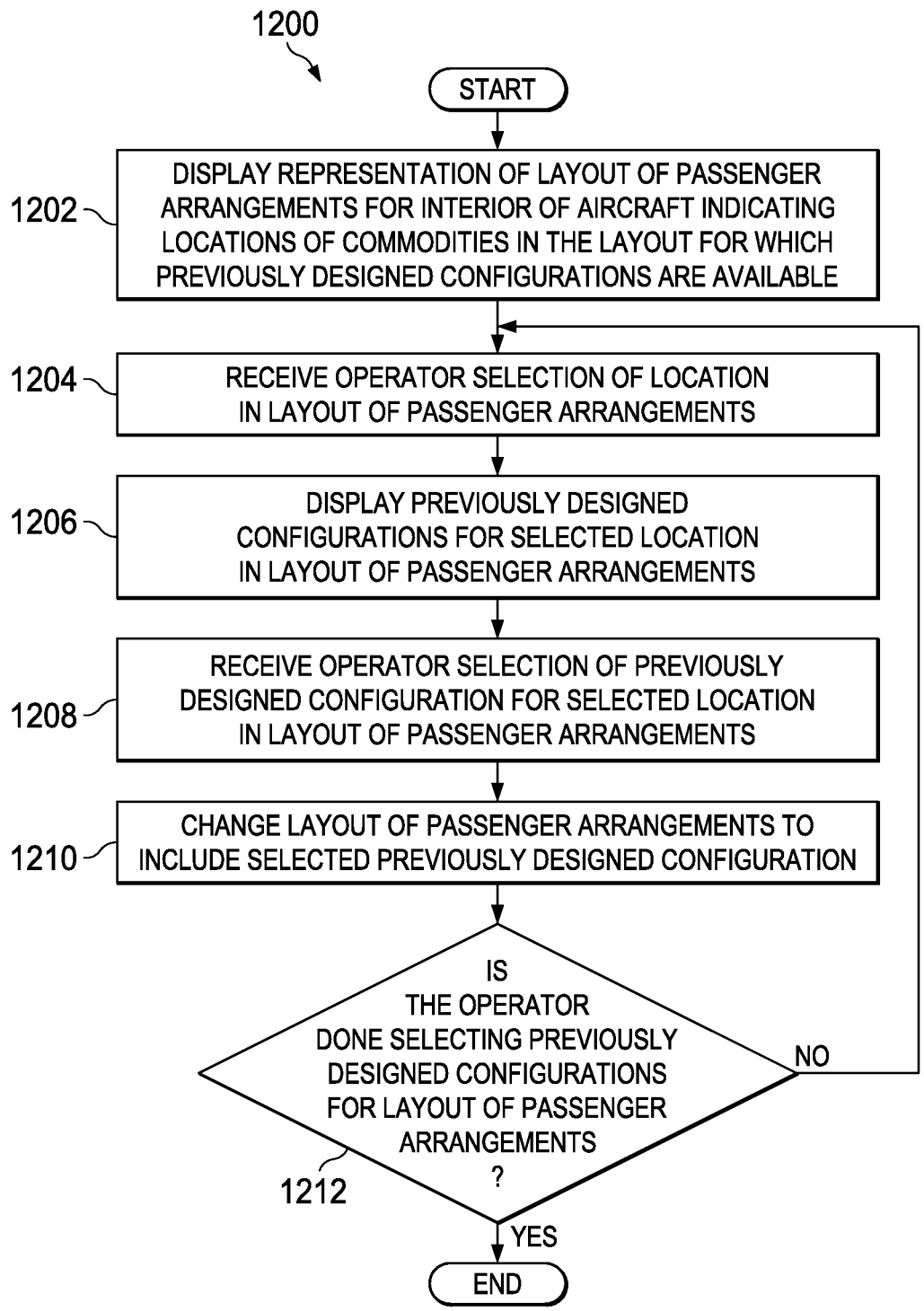
FIG. 12 is an illustration of a flowchart of a process designing a layout of passenger arrangements for an aircraft using previously designed configurations in accordance with an illustrative embodiment.

Turning to FIG. 12, an illustration of a flowchart of a process designing a layout of passenger arrangements for an aircraft using previously designed configurations is depicted in accordance with an illustrative embodiment. Process 1200 may be performed, for example, using previously designed configuration identification and selection tool 210 in layout of passenger arrangements optimization system 200 in FIG. 2.

Process 1200 may begin with displaying a representation of passenger arrangements for an interior of an aircraft indicating locations of commodities in the layout for which previously designed configurations are available (operation 1202). An operator selection of a location in the layout of passenger arrangements then may be received (operation 1204). Previously designed configurations for the selected location in the layout of passenger arrangements then may be displayed (operation 1206). An operator selection of one of the previously designed configurations displayed then may be received (operation 1208). The layout of the passenger arrangements then may be changed to include the selected previously designed configuration (operation 1210).

It then may be determined whether the operator is done selecting previously designed configurations for the layout of passenger arrangements (operation 1212). Process 1200 may return to operation 1204 in response to a determination that the operator is not done.

Otherwise, the process may terminate.

Figure 13:
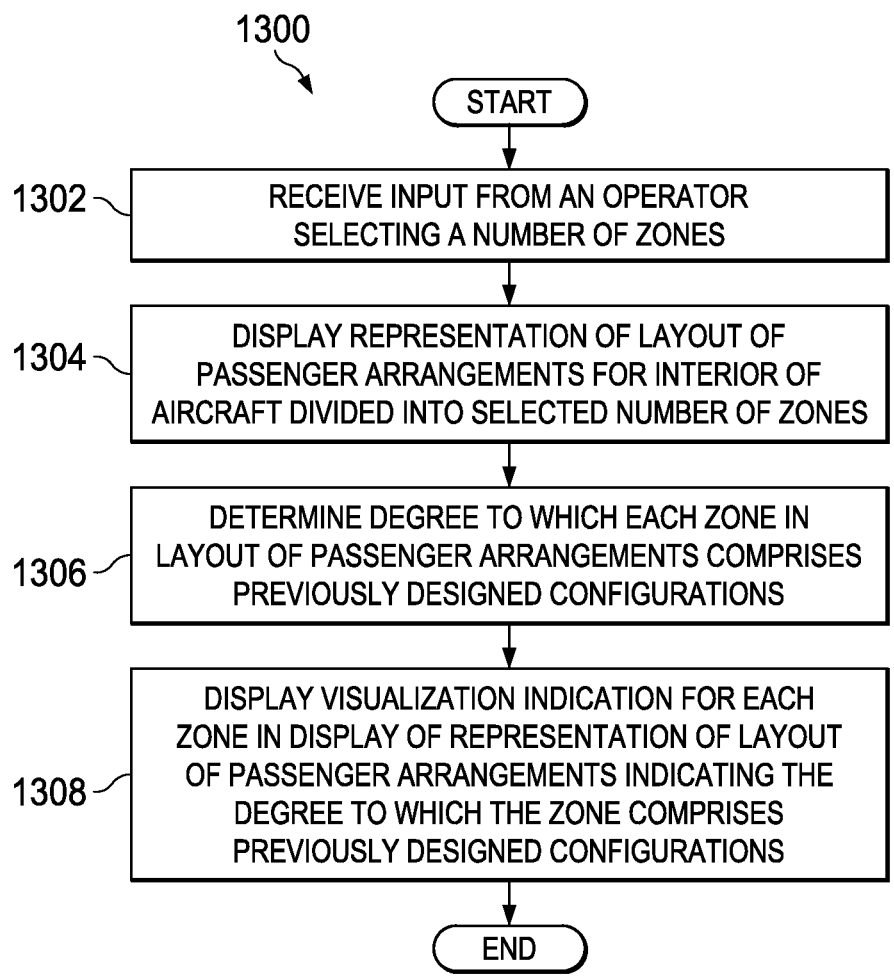
FIG. 13 is an illustration of a flowchart of a process for indicating relative levels of use of previously designed configurations in a layout of passenger arrangements for an aircraft in accordance with an illustrative embodiment.

Turning now to FIG. 13, an illustration of a flowchart of a process for indicating relative levels of use of previously designed configurations in a layout of passenger arrangements for an aircraft is depicted in accordance with an illustrative embodiment. Process 1300 may be performed, for example, using previously designed configurations visualization tool 212 in layout of passenger arrangements optimization system 200 in FIG. 2.

Process 1300 may begin with receiving an input from an operator selecting a number of zones (operation 1302). A representation of a layout of passenger arrangements for an interior of an aircraft divided into the selected number of zones then may be displayed (operation 1304). A level of use of previously designed configurations in each of the number of zones then may be determined (operation 1306). A visualization indication of the level of use of previously designed configurations in each zone of the layout of passenger arrangements then may be displayed (operation 1308) in the graphical representation of the layout of passenger arrangements, with the process terminating thereafter.

Figure 14:
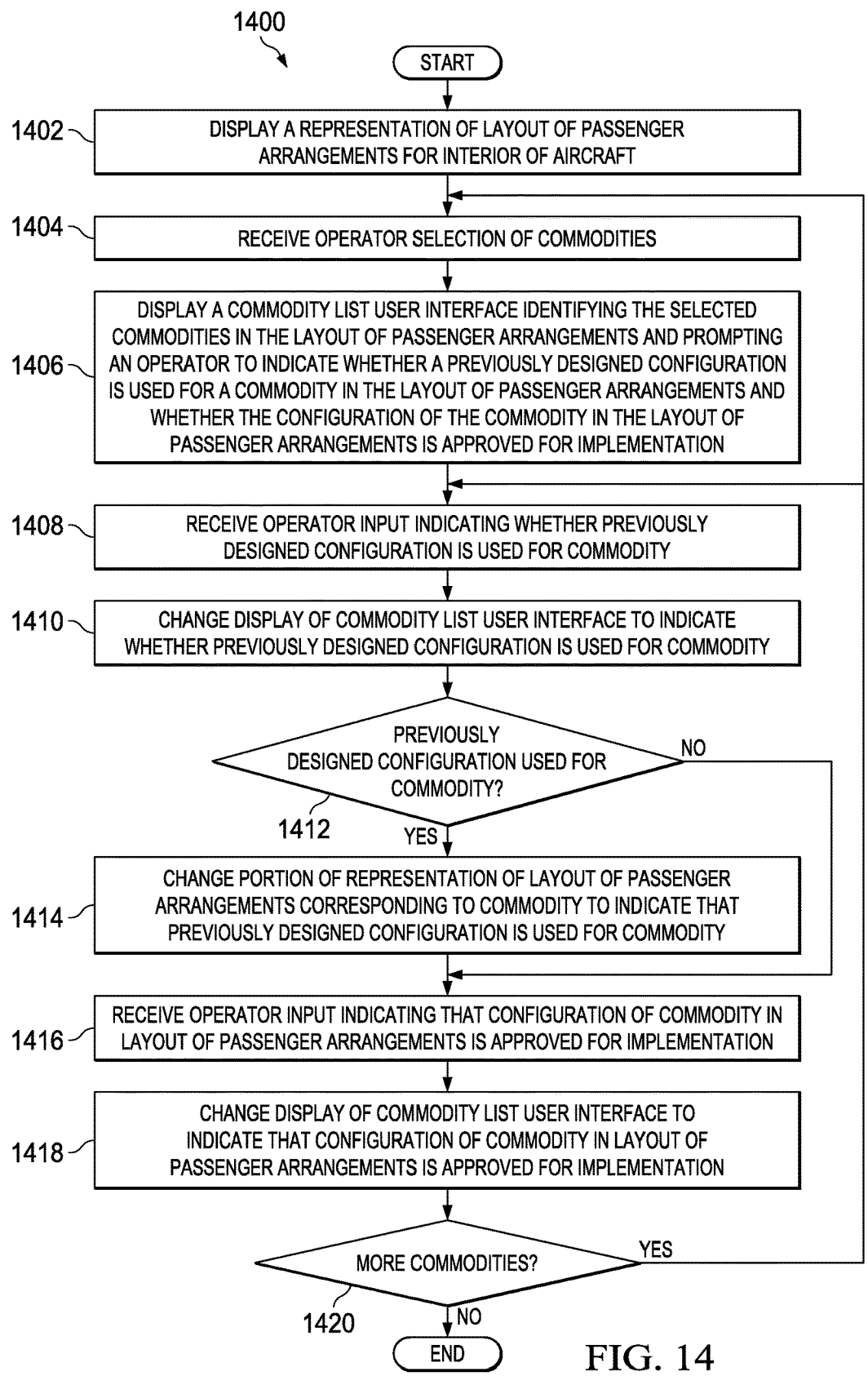
FIG. 14 is an illustration of a flowchart of a process for the management and tracking of configurations for commodities in a layout of passenger arrangements for an aircraft in accordance with an illustrative embodiment.

Turning to FIG. 14, an illustration of a flowchart of a process for the management and tracking of configurations for commodities in a layout of passenger arrangements for an aircraft is depicted in accordance with an illustrative embodiment. Process 1400 may be performed, for example, using installation management and tracking tool 214 in layout of passenger arrangements optimization system 200 in FIG. 2 and installation management and tracking tool user interface 600 in FIG. 6.

Process 1400 may begin with displaying a graphical representation of a layout of passenger arrangements for an interior of an aircraft (operation 1402). An operator selection of commodities then may be received (operation 1404). A commodity list user interface identifying the selected commodities in the layout of passenger arrangements and prompting an operator to indicate whether a previously designed configuration is used for a commodity in the layout of passenger arrangements and whether the configuration of the commodity in the layout of passenger arrangements is approved for implementation is displayed (operation 1406).

Operator input indicating whether a previously designed configuration is used for a commodity is received (operation 1408). The display of the commodity list user interface is changed to indicate whether a previously designed configuration is used for the commodity (operation 1410), based on the input from the operator in operation 1408.

It then may be determined whether the operator input in operation 1408 indicated that a previously designed configuration is used for the commodity (operation 1412). In response to a determination that a previously designed configuration is used for the commodity, a portion of the graphical representation of the layout of passenger arrangements corresponding to the commodity may be changed to indicate that a previously designed configuration is used for the commodity (operation 1414). For example, without limitation, the color of the portion of the graphical representation of the layout of passenger arrangements may be changed to indicate that a previously designed configuration is used for the commodity. Operation 1414 may not be performed, with process 1400 proceeding directly from operation 1412 to operation 1416, in response to a determination at operation 1412 that a previously designed configuration is not used for the commodity.

Operator input indicating that the configuration of the commodity in the layout of passenger arrangements is approved for implementation may be received (operation 1416). In this case, the display of the commodity list user interface may be changed to indicate that the configuration of the commodity in the layout of passenger arrangements is approved for implementation (operation 1418).

It then may be determined whether there are more commodities in the layout of passenger arrangements to be managed and tracked at this time (operation 1420). If there are more commodities to be managed and tracked, process 1400 may return to operation 1404 or 1408. Process 1400 may terminate in response to a determination at operation 1420 that there are no more commodities to manage and track at this time.

Figure 15:
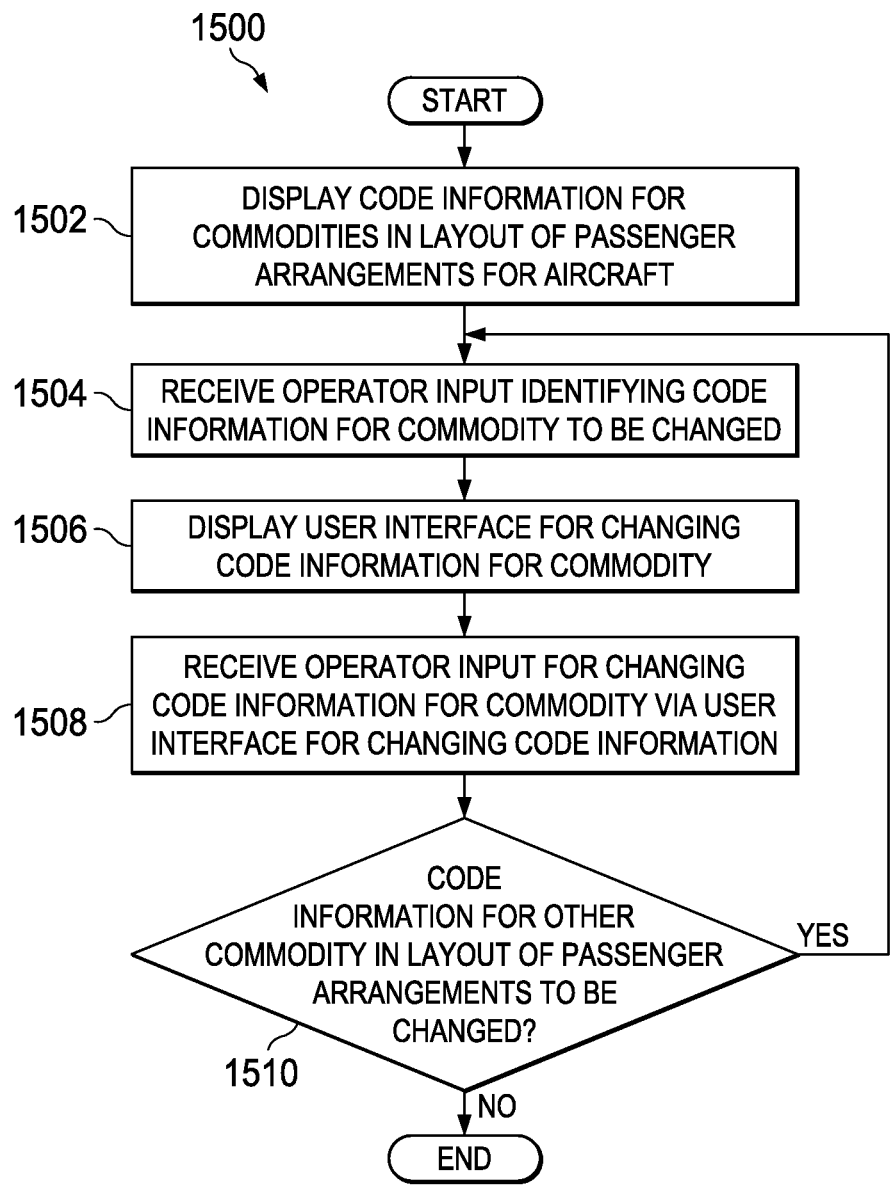
FIG. 15 is an illustration of a flowchart of a process for changing code information for configurations of commodities in accordance with an illustrative embodiment.

Turning to FIG. 15, an illustration of a flowchart of a process for changing code information for configurations of commodities is depicted in accordance with an illustrative embodiment. Process 1500 may be performed, for example, using coding tool 216 in layout of passenger arrangements optimization system 200 in FIG. 2.

Process 1500 may begin with displaying code information for commodities in a layout of passenger arrangements for an aircraft (operation 1502). Operator input identifying code information for one of the commodities that is to be changed may be received (operation 1504). A user interface for changing the code information for the one of the commodities then may be displayed (operation 1506). Operator input for changing the code information for the commodity then may be received via the user interface for changing the code information (operation 1508).

It then may be determined whether code information for another commodity in the layout of passenger arrangements is to be changed (operation 1510). In response to a determination that code information for another commodity is to be changed, process 1500 may return to operation 1504, in which operator input identifying code information for another commodity to be changed may be received. Otherwise, process 1500 may terminate.

Figure 16:
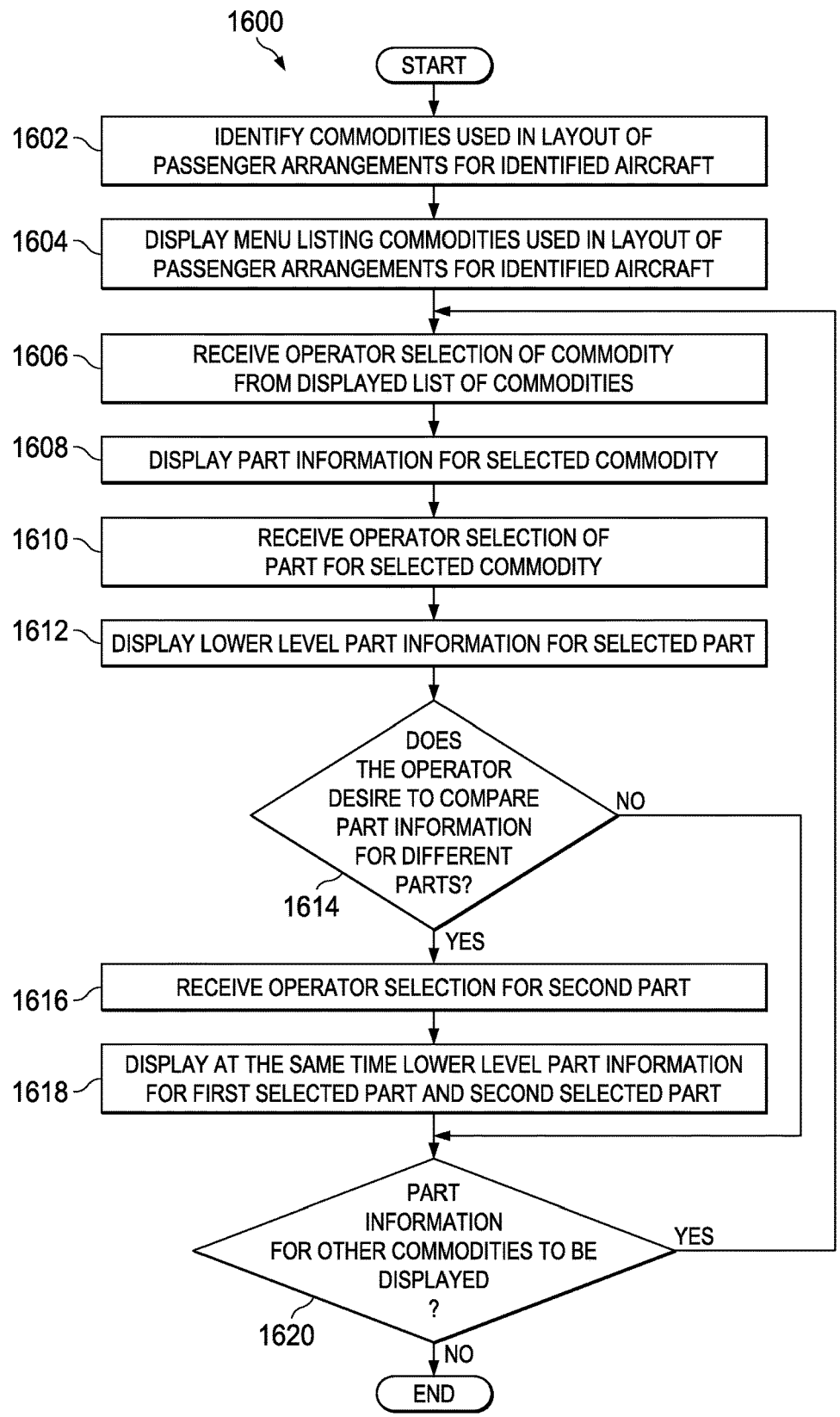
FIG. 16 is an illustration of a flowchart of a process for displaying part information for parts used to implement commodities in accordance with an illustrative embodiment.

Turning to FIG. 16, an illustration of a flowchart of a process for displaying part information for parts used to implement commodities is depicted in accordance with an illustrative embodiment. Process 1600 may be performed, for example, using parts used on tool 218 in layout of passenger arrangements optimization system 200 in FIG. 2.

Process 1600 may begin with identifying commodities used in a layout of passenger arrangements for an identified aircraft (operation 1602). A user interface listing commodities used in the layout of passenger arrangements for the identified aircraft then may be displayed (operation 1604). An operator selection of a commodity from the displayed list of commodities may be received (operation 1606). Part information for the selected commodity then may be displayed (operation 1608). An operator selection of a part for the selected commodity may be received (operation 1610). Lower level part information for the selected part then may be displayed (operation 1612).

It then may be determined whether the operator desires to compare part information for different parts (operation 1614). In response to a determination that a comparison of part information for different parts is desired, an operator selection of a second part may be received (operation 1616). Lower level part information for the first selected part and the second selected part then may be displayed at the same time (operation 1618), to allow the desired comparison to be made. In response to a determination at operation 1614 that a comparison will not be made, process 1600 may proceed directly to operation 1620.

It then may be determined whether part information for other commodities is to be displayed (operation 1620). Process 1600 may return to operation 1606 in response to a determination that part information for other commodities is to be displayed. Otherwise, process 1600 may terminate.

Figure 17:
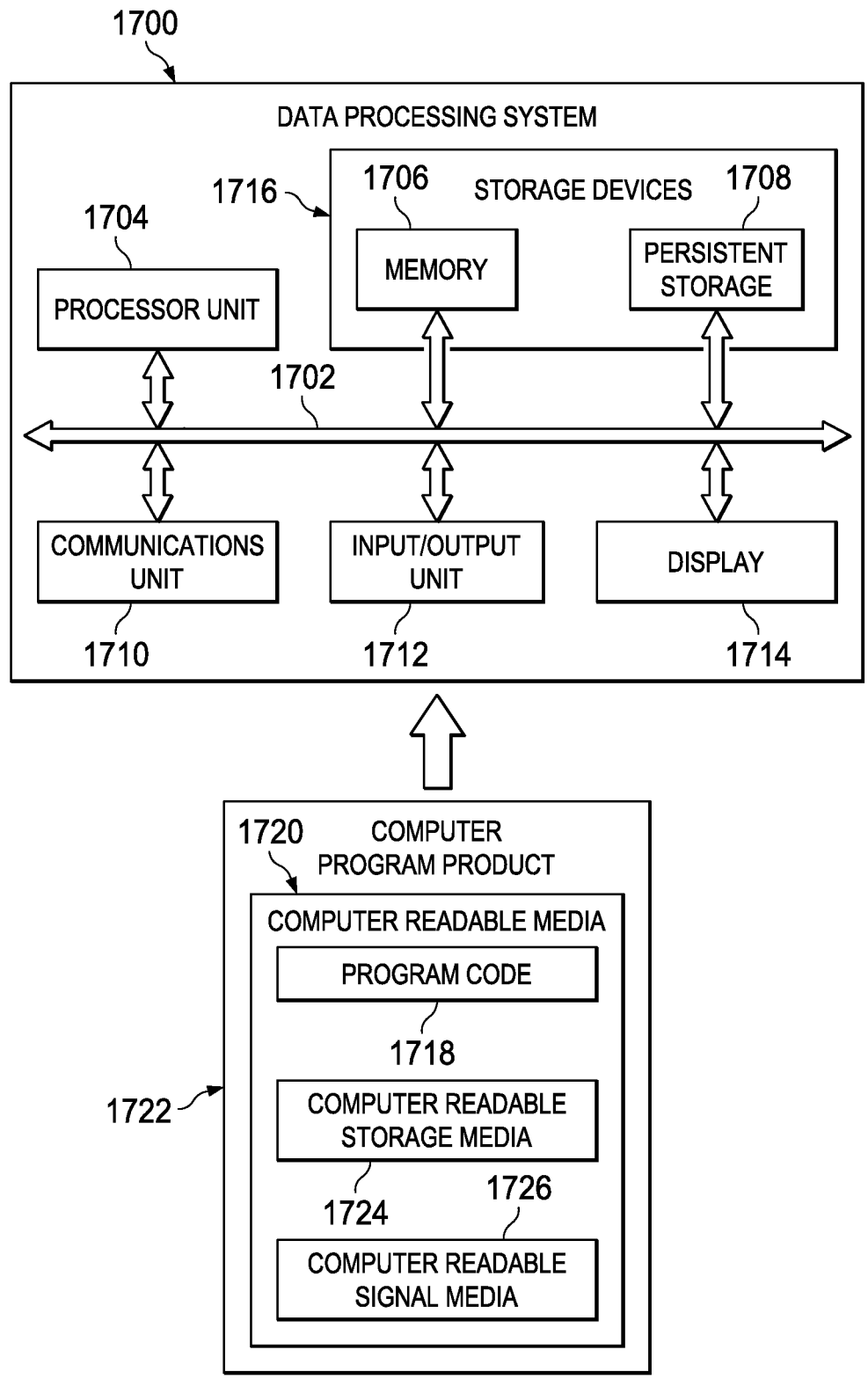
FIG. 17 is an illustration of a block diagram of a data processing system in accordance with an illustrative embodiment.

Turning now to FIG. 17, an illustration of a block diagram of a data processing system is depicted in accordance with an illustrative embodiment. Data processing system 1700 may be an example of one implementation of data processing system 120 in FIG. 1. In this illustrative example, data processing system 1700 includes communications framework 1702, which provides communications between processor unit 1704, memory 1706, persistent storage 1708, communications unit 1710, input/output (I/O) unit 1712, and display 1714. In these examples, communications unit 1710 may be a bus system.

Processor unit 1704 serves to execute instructions for software that may be loaded into memory 1706. Processor unit 1704 may be a number of processors, a multi-processor core, or some other type of processor, depending on the particular implementation. A number, as used herein with reference to an item, means one or more items. Further, processor unit 1704 may be implemented using a number of heterogeneous processor systems in which a main processor is present with secondary processors on a single chip. As another illustrative example, processor unit 1704 may be a symmetric multi-processor system containing multiple processors of the same type.

Memory 1706 and persistent storage 1708 are examples of storage devices 1716. A storage device is any piece of hardware that is capable of storing information, such as, for example, without limitation, data, program code in functional form, and/or other suitable information either on a temporary basis and/or a permanent basis. Storage devices 1716 may also be referred to as computer readable storage devices in these examples. Memory 1706, in these examples, may be, for example, a random access memory or any other suitable volatile or non-volatile storage device. Persistent storage 1708 may take various forms, depending on the particular implementation.

For example, persistent storage 1708 may contain one or more components or devices. For example, persistent storage 1708 may be a hard drive, a flash memory, a rewritable optical disk, a rewritable magnetic tape, or some combination of the above. The media used by persistent storage 1708 also may be removable. For example, a removable hard drive may be used for persistent storage 1708.

Communications unit 1710, in these examples, provides for communications with other data processing systems or devices. In these examples, communications unit 1710 is a network interface card. Communications unit 1710 may provide communications through the use of either or both physical and wireless communications links.

Input/output unit 1712 allows for input and output of data with other devices that may be connected to data processing system 1700. For example, input/output unit 1712 may provide a connection for user input through a keyboard, a mouse, and/or some other suitable input device. Further, input/output unit 1712 may send output to a printer. Display 1714 provides a mechanism to display information to a user.

Instructions for the operating system, applications, and/or programs may be located in storage devices 1716, which are in communication with processor unit 1704 through communications framework 1702. In these illustrative examples, the instructions are in a functional form on persistent storage 1708. These instructions may be loaded into memory 1706 for execution by processor unit 1704. The processes of the different embodiments may be performed by processor unit 1704 using computer implemented instructions, which may be located in a memory, such as memory 1706.

These instructions are referred to as program code, computer usable program code, or computer readable program code that may be read and executed by a processor in processor unit 1704. The program code in the different embodiments may be embodied on different physical or computer readable storage media, such as memory 1706 or persistent storage 1708.

Program code 1718 is located in a functional form on computer readable media 1720 that is selectively removable and may be loaded onto or transferred to data processing system 1700 for execution by processor unit 1704. Program code 1718 and computer readable media 1720 form computer program product 1722 in these examples. In one example, computer readable media 1720 may be computer readable storage media 1724 or computer readable signal media 1726. Computer readable storage media 1724 may include, for example, an optical or magnetic disk that is inserted or placed into a drive or other device that is part of persistent storage 1708 for transfer onto a storage device, such as a hard drive, that is part of persistent storage 1708. Computer readable storage media 1724 also may take the form of a persistent storage, such as a hard drive, a thumb drive, or a flash memory, that is connected to data processing system 1700.

In some instances, computer readable storage media 1724 may not be removable from data processing system 1700. In these examples, computer readable storage media 1724 is a physical or tangible storage device used to store program code 1718 rather than a medium that propagates or transmits program code 1718. Computer readable storage media 1724 is also referred to as a computer readable tangible storage device or a computer readable physical storage device. In other words, computer readable storage media 1724 is a media that can be touched by a person.

Alternatively, program code 1718 may be transferred to data processing system 1700 using computer readable signal media 1726. Computer readable signal media 1726 may be, for example, a propagated data signal containing program code 1718. For example, computer readable signal media 1726 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 1718 may be downloaded over a network to persistent storage 1708 from another device or data processing system through computer readable signal media 1726 for use within data processing system 1700. For instance, program code stored in a computer readable storage medium in a server data processing system may be downloaded over a network from the server to data processing system 1700. The data processing system providing program code 1718 may be a server computer, a client computer, or some other device capable of storing and transmitting program code 1718.

The different components illustrated for data processing system 1700 are not meant to provide architectural limitations to the manner in which different embodiments may be implemented. The different illustrative embodiments may be implemented in a data processing system including components in addition to or in place of those illustrated for data processing system 1700. Other components shown in FIG. 17 can be varied from the illustrative examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

In another illustrative example, processor unit 1704 may take the form of a hardware unit that has circuits that are manufactured or configured for a particular use. This type of hardware may perform operations without needing program code to be loaded into a memory from a storage device to be configured to perform the operations.

For example, when processor unit 1704 takes the form of a hardware unit, processor unit 1704 may be a circuit system, an application-specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, programmable array logic, a field programmable logic array, a field programmable gate array, and other suitable hardware devices. With this type of implementation, program code 1718 may be omitted because the processes for the different embodiments are implemented in a hardware unit.

In still another illustrative example, processor unit 1704 may be implemented using a combination of processors found in computers and hardware units. Processor unit 1704 may have a number of hardware units and a number of processors that are configured to run program code 1718. With this depicted example, some of the processes may be implemented in the number of hardware units, while other processes may be implemented in the number of processors.

In another example, a bus system may be used to implement communications framework 1702 and may be comprised of one or more buses, such as a system bus or an input/output bus. Of course, the bus system may be implemented using any suitable type of architecture that provides for a transfer of data between different components or devices attached to the bus system.

Additionally, a communications unit may include a number of more devices that transmit data, receive data, or transmit and receive data. A communications unit may be, for example, a modem or a network adapter, two network adapters, or some combination thereof. Further, a memory may be, for example, memory 1706, or a cache, such as found in an interface and memory controller hub that may be present in communications framework 1702.

Figure 18:
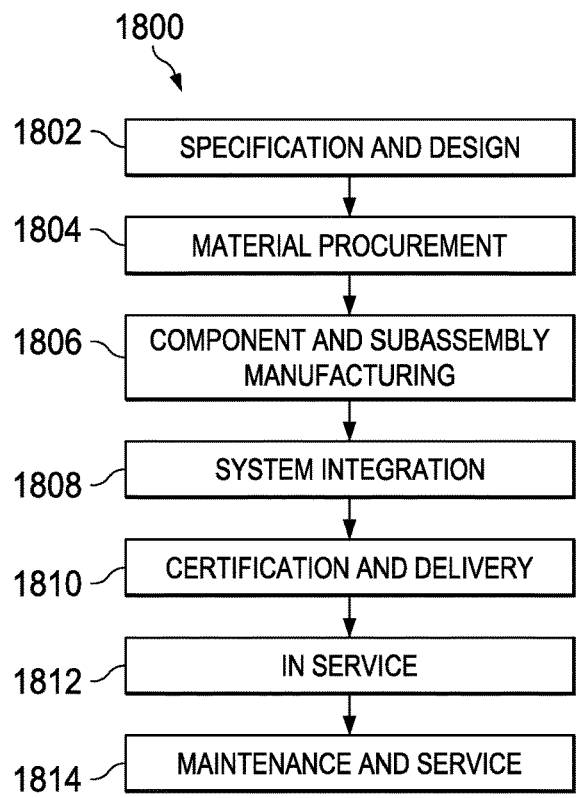
FIG. 18 is an illustration of a block diagram of an aircraft manufacturing and service method in accordance with an illustrative embodiment.
Figure 19:
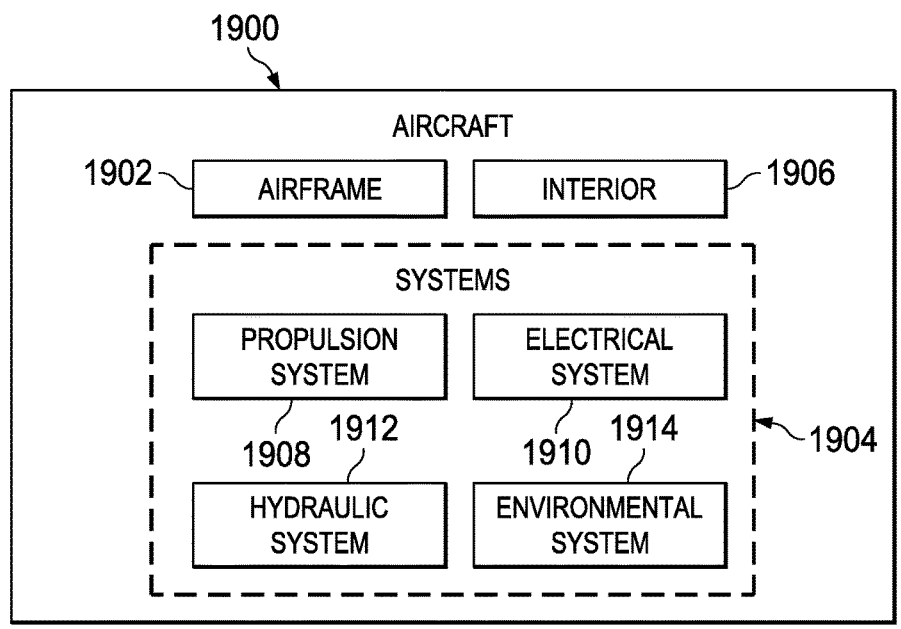
FIG. 19 is an illustration of a block diagram of an aircraft in which an illustrative embodiment may be implemented.

Illustrative embodiments of the disclosure may be described in the context of aircraft manufacturing and service method 1800 as shown in FIG. 18 and aircraft 1900 as shown in FIG. 19. Turning first to FIG. 18, an illustration of a block diagram of an aircraft manufacturing and service method is depicted in accordance with an illustrative embodiment. During pre-production, aircraft manufacturing and service method 1800 may include specification and design 1802 of aircraft 1900 in FIG. 19 and material procurement 1804.

During production, component and subassembly manufacturing 1806 and system integration 1808 of aircraft 1900 in FIG. 19 takes place. Thereafter, aircraft 1900 in FIG. 19 may go through certification and delivery 1810 in order to be placed in service 1812. While in service 1812 by a customer, aircraft 1900 in FIG. 19 is scheduled for routine maintenance and service 1814, which may include modification, reconfiguration, refurbishment, and other maintenance or service.

Each of the processes of aircraft manufacturing and service method 1800 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 19, an illustration of a block diagram of an aircraft is depicted in which an illustrative embodiment may be implemented. In this example, aircraft 1900 is produced by aircraft manufacturing and service method 1800 in FIG. 18 and may include airframe 1902 with plurality of systems 1904 and interior 1906. Examples of systems 1904 include one or more of propulsion system 1908, electrical system 1910, hydraulic system 1912, and environmental system 1914. Any number of other systems may be included. Although an aerospace example is shown, different illustrative embodiments may be applied to other industries that manufacture vehicles. For example, the illustrative embodiments may be applied to other industries, such as the automotive industry, the ship building industry, and other suitable industries.

Apparatuses and methods embodied herein may be employed during at least one of the stages of aircraft manufacturing and service method 1800 in FIG. 18. In one illustrative example, components or subassemblies produced in component and subassembly manufacturing 1806 in FIG. 18 may be fabricated or manufactured in a manner similar to components or subassemblies produced while aircraft 1900 is in service 1812 in FIG. 18.

In another example, one or more illustrative embodiments may be used during specification and design 1802 to reuse previously designed configurations in a design for the layout of passenger arrangements for interior 1906 aircraft 1900. Further, one or more illustrative embodiments also may be used during maintenance and service 1814. An illustrative embodiment may be implemented for use during maintenance and service 1814 to select designs for use in options that may be selected for upgrades, refurbishing, or other operations performed on aircraft 1900. The use of a number of the different illustrative embodiments may substantially expedite the assembly of and/or reduce the cost of aircraft 1900.

Thus, the different illustrative embodiments provide a method and apparatus for manufacturing platforms such as aircraft. The different illustrative embodiments provide tools for using previously designed configurations to implement a layout of passenger arrangements for an aircraft.

In this manner, an aircraft may be manufactured, modified, or upgraded to embody a final design. The final design may be, for example, for the aircraft when the aircraft is manufactured as a deliverable to the customer or for the option if the option is added to the aircraft after the aircraft has been manufactured.

With one or more illustrative embodiments, the time needed to manufacture an aircraft may be reduced. In particular, the time needed for implementing a layout of passenger arrangements for an aircraft based on selections by customers may be reduced because the time and expense needed for the detailed design of the layout of passenger arrangements may be reduced through the use of previously designed configurations as described above.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method of implementing a layout of passenger arrangements for an aircraft comprising:
displaying a graphical representation of the layout;
displaying an indicator on the graphical representation of the layout indicating a location of a commodity, in the layout, for which a previously designed configuration exists;

displaying, in response to an operator selecting the location of the commodity, a list of previously designed configurations for the location;
receiving a selection of a selected previously designed configuration from the list of the previously designed configurations; and
changing the layout via including the selected previously designed configuration at the location.

2. The method of claim 1 further comprising:
displaying the graphical representation of the layout divided into a number of zones;
receiving additional selections of additionally selected previously designed configurations from the list of the previously designed configurations;
changing the layout via including the additionally selected previously designed configurations at additional locations within the number of zones; and
displaying a visualization indication on the graphical representation of the layout indicating all selected previously designed configurations in each zone in the number of zones in the layout.

3. The method of claim 1 further comprising:
displaying a commodity list user interface identifying a commodity in the layout and prompting an operator to indicate whether a previously designed configuration is used for the commodity in the layout.

4. The method of claim 3 further comprising:
in response to receiving an input from an operator indicating that the previously designed configuration is used for the commodity in the layout, changing a portion of the graphical representation of the layout corresponding to the commodity to indicate that the previously designed configuration is used for the commodity.

5. The method of claim 3 further comprising:
prompting an input to the commodity list user interface indicating an approval for implementing a configuration for the commodity in the layout; and
implementing, in response to receiving the approval, the commodity in the layout.

6. The method of claim 1 further comprising:
displaying a previously designed layout of passenger arrangements identification tool user interface prompting an operator to define a plurality of characteristics of the aircraft;
receiving input via the previously designed layout of passenger arrangements identification tool user interface defining the plurality of characteristics of the aircraft;
searching a database to identify a number of previously designed layouts of passenger arrangements defined in the database comprising the plurality of characteristics of the aircraft;
displaying graphical representations of the number of previously designed layouts; and
selecting a one of the number of previously designed layouts as the layout of passenger arrangements for the aircraft.

7. The method of claim 6, further comprising selecting the plurality of characteristics of the aircraft from a group comprising: number of seats, type of seats, seat supplier, ratio of lavatories to seats, ratio of galleys to seats, and ratio of closets to seats.

8. The method of claim 6, wherein the number of previously designed layouts defined in the database are selected from previously used layouts implemented in manufactured aircraft and previously defined layouts.

9. A method of implementing a layout of passenger arrangements for an aircraft comprising:
displaying a graphical representation of the layout;
receiving a selection of a selected previously designed configuration from a list of previously designed configurations for a commodity at a location in the layout; and
displaying a visualization indication on the graphical representation of the layout indicating locations on the graphical representation incorporating the selected previously designed configuration in the layout.

10. The method of claim 9 further comprising:
displaying the graphical representation of the layout divided into a plurality of zones;
receiving additional selections of additionally selected previously designed configurations from the list of the previously designed configurations;
changing the layout via including the additionally selected previously designed configurations at additional locations within the plurality of zones; and
displaying the visualization indication comprises displaying the visualization indication on the graphical representation of the layout indicating all selected previously designed configurations in each zone in the plurality of zones.

11. The method of claim 10, wherein the visualization indication comprises a color of each zone in the graphical representation of the layout indicating the all selected previously designed configurations in each zone.

12. An apparatus that comprises:
a plurality of tools configured to implement a layout of passenger arrangements that comprises new and previously designed configurations, such that the plurality of tools comprises:
a previously designed configurations identification and selection tool configured to select previously designed configurations to include in the layout;
a previously designed configurations visualization tool configured to display the new and the previously designed configurations in the layout of passenger arrangements; and
a tool selection user interface configured to receive input that selects a one of the plurality of tools to use.

13. The apparatus of claim 12, further comprising the previously designed configurations identification and selection tool configured to:
display a graphical representation of the layout;
display an indicator on the graphical representation of the layout, that indicates a location of a commodity in the layout for which previously designed configurations exist;
display, in response to a selection of the location of the commodity via a user interface, a list of the previously designed configurations;
receive a selection by an operator of a selected previously designed configuration from the list of the previously designed configurations; and
change the layout to include the selected previously designed configuration.

14. The apparatus of claim 12, wherein the previously designed configurations visualization tool is configured to:
display a graphical representation of the layout divided into a number of zones;

determine a level of use of previously designed configurations in each zone in the number of zones in the layout; and display a visualization indication on the graphical representation of the layout indicating the level of use of previously designed configurations in each zone in the number of zones.

15. The apparatus of claim 12, wherein the plurality of tools further comprises an installation management and tracking tool configured to:

display a graphical representation of the layout;

display a commodity list user interface that identifies a commodity in the layout and prompts an input that indicates a use of a previously designed configuration for the commodity in the layout; and in response to receiving the input of the use, change a portion, that corresponds to the commodity, of the graphical representation of the layout to indicate the use.

16. The apparatus of claim 15, wherein the installation management and tracking tool is further configured to:

prompt an input that indicates an approval for implementation for a configuration for the commodity in the layout.

17. The apparatus of claim 12, wherein the plurality of tools further comprises a previously designed layout of passenger arrangements identification tool configured to:

display a previously designed layout of passenger arrangements identification tool user interface configured to prompt definitions for a plurality of characteristics of an aircraft;

receive, via the previously designed layout of passenger arrangements identification tool user interface, the definitions for the plurality of characteristics of the aircraft;

search a database to identify a number of previously designed layouts of passenger arrangements defined in the database that comprise the plurality of characteristics of the aircraft;

display graphical representations of the number of previously designed layouts; and receive a selection of a one of the number of previously designed layouts as the layout of passenger arrangements for the aircraft.

18. The apparatus of claim 17, further comprising:

a selection of the plurality of characteristics of the aircraft from a group that comprises: number of seats, type of seats, seat supplier, ratio of lavatories to seats, ratio of galleys to seats, and ratio of closets to seats; and a selection of the number of previously designed layouts defined in the database from a group that comprises: previously used layouts of passenger arrangements implemented in previously manufactured aircraft, and previously defined layouts of passenger arrangements.

19. The apparatus of claim 12, wherein the plurality of tools further comprises a coding tool configured to view and change code information for configurations of commodities in the layout.

20. The apparatus of claim 12, wherein the plurality of tools further comprises a parts used on tool configured to display part information for parts used to implement commodities in the layout.

* * * * *